(12) United States Patent
Kang

(10) Patent No.: US 11,855,650 B2
(45) Date of Patent: Dec. 26, 2023

(54) APPARATUS AND METHOD FOR FREQUENCY MULTIPLICATION

(71) Applicant: Electronics and Telecommunications Research Institute, Daejeon (KR)

(72) Inventor: Dongwoo Kang, Sejong-si (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 214 days.

(21) Appl. No.: 17/323,437

(22) Filed: May 18, 2021

(65) Prior Publication Data

US 2021/0367606 A1  Nov. 25, 2021

(30) Foreign Application Priority Data

May 19, 2020 (KR) .......................... 10-2020-0059451

(51) Int. Cl.

| H03B 19/14 | (2006.01) |
|---|---|
| H03B 19/10 | (2006.01) |
| H03B 21/04 | (2006.01) |
| H03L 7/16 | (2006.01) |
| H04B 1/40 | (2015.01) |
| H03K 5/00 | (2006.01) |

(52) U.S. Cl.
CPC ............... *H03L 7/16* (2013.01); *H03B 19/10* (2013.01); *H03B 19/14* (2013.01); *H03B 21/04* (2013.01); *H03K 5/00006* (2013.01); *H04B 1/40* (2013.01); *H03L 2207/10* (2013.01)

(58) Field of Classification Search
CPC .......... H03B 19/10; H03B 19/14; H03B 21/04
USPC ........................................ 327/116, 119–122
See application file for complete search history.

(56) References Cited

U.S. PATENT DOCUMENTS

| 3,208,006 A | * | 9/1965 | Duzer .................... H03B 21/04 331/38 |
|---|---|---|---|
| 3,593,139 A | * | 7/1971 | Hershberg ............. H04B 7/185 330/61 A |
| 3,745,458 A | * | 7/1973 | Nakamura .......... H04L 27/2278 329/305 |
| 3,745,559 A | * | 7/1973 | Mattern .................. H03M 1/00 341/111 |
| 4,725,786 A | * | 2/1988 | Papaieck ................ H03B 21/02 331/40 |

(Continued)

FOREIGN PATENT DOCUMENTS

| JP | 2000-101352 | 4/2000 |
|---|---|---|
| KR | 10-1213473 | 12/2012 |

*Primary Examiner* — Levi Gannon
(74) *Attorney, Agent, or Firm* — KILE PARK REED & HOUTTEMAN PLLC

(57) ABSTRACT

Disclosed is a frequency multiplication apparatus including a first frequency multiplier receiving a first signal having a first frequency and outputting a second signal having a second frequency by multiplying the first frequency by 'n' ('n' being a positive integer), a second frequency multiplier receiving the second signal and outputting a third signal having a third frequency by multiplying the second frequency by 'm' ('m' being a positive integer), and a coupler connected between an output of the first frequency multiplier and an input of the second frequency multiplier and outputting a part of the second signal.

18 Claims, 6 Drawing Sheets

(56) References Cited

U.S. PATENT DOCUMENTS

| | | | |
|---|---|---|---|
| 6,346,912 B1 * | 2/2002 | Reinhart | G01S 1/0428 |
| | | | 342/385 |
| 6,388,546 B1 | 5/2002 | Kikokawa et al. | |
| 6,456,143 B2 | 9/2002 | Masumoto et al. | |
| 6,703,876 B2 * | 3/2004 | Fujiwara | H03L 7/23 |
| | | | 331/DIG. 2 |
| 7,013,121 B1 * | 3/2006 | Koh | H04B 1/403 |
| | | | 455/314 |
| 7,432,768 B2 | 10/2008 | Han et al. | |
| 8,120,433 B2 | 2/2012 | Kim et al. | |
| 8,901,973 B2 | 12/2014 | Ehlers et al. | |
| 10,495,685 B2 | 12/2019 | Kang et al. | |
| 2003/0229815 A1 * | 12/2003 | Fujiwara | G11B 20/1403 |
| 2012/0274368 A1 * | 11/2012 | McCorkle | H03B 19/00 |
| | | | 327/119 |
| 2017/0288607 A1 | 10/2017 | Alijabbari et al. | |
| 2018/0156861 A1 * | 6/2018 | Kang | G01R 31/2822 |
| 2020/0028499 A1 * | 1/2020 | Bellaouar | H03L 7/16 |
| 2020/0200867 A1 * | 6/2020 | Belfiore | H03B 19/14 |

\* cited by examiner

APPARATUS AND METHOD FOR FREQUENCY MULTIPLICATION

CROSS-REFERENCE TO RELATED APPLICATIONS

This application claims priority under 35 U.S.C. § 119 to Korean Patent Application No. 10-2020-0059451 filed on May 19, 2020, in the Korean Intellectual Property Office, the disclosures of which are incorporated by reference herein in their entireties.

BACKGROUND

Embodiments of the present disclosure described herein relate to an apparatus and method for frequency multiplying, and more particularly, relate to an apparatus and method for frequency multiplying that are capable of supporting different frequency bands and adjusting a multiplication number.

Nowadays, as interest in technologies associated with beyond 5th generation (B5G) and 6th generation (6G) increases, a research on the utilization of a frequency of 100 GHz or higher is being conducted actively. At present, a signal source of 100 GHz or higher may be implemented using a device capable of self-oscillation, or may be implemented by multiplying a frequency output from a stable signal source implemented at a low frequency.

When the device capable of self-oscillation is used, a high-output signal source may be provided. However, when the signal source is utilized, a scan range of a frequency may be very narrow. Accordingly, it is difficult for the signal source to be applied in various fields.

On the other hand, when a high-frequency signal source is implemented by multiplying the frequency, it may be easy to implement a signal source that scans a frequency in a broadband at a low frequency. Furthermore, the scan range of a frequency may increase in proportion to a multiplication number by multiplying the frequency. Moreover, a stable signal source such as a phase locking loop (PLL) may be implemented. Accordingly, most of signal sources in a millimeter-wave band are implemented using a frequency multiplication method.

SUMMARY

Embodiments of the present disclosure provide an apparatus and method for frequency multiplying that are capable of supporting different frequency bands and adjusting a multiplication number.

According to an embodiment, an apparatus includes a first frequency multiplier receiving a first signal having a first frequency and outputting a second signal having a second frequency by multiplying the first frequency by 'n' ('n' being a positive integer), a second frequency multiplier receiving the second signal and outputting a third signal having a third frequency by multiplying the second frequency by 'm' ('m' being a positive integer), and a coupler connected between an output of the first frequency multiplier and an input of the second frequency multiplier and outputting a part of the second signal.

According to an embodiment, a frequency multiplication method includes receiving an initial signal having a first initial frequency, generating a first signal having a first multiplication frequency by multiplying the first initial frequency by 'n' ('n' being a positive integer), transmitting the first signal to a first coupler circuit, and outputting the first signal to a first external device through the first coupler circuit.

BRIEF DESCRIPTION OF THE FIGURES

The above and other objects and features of the present disclosure will become apparent by describing in detail embodiments thereof with reference to the accompanying drawings.

DETAILED DESCRIPTION

Hereinafter, embodiments of the present disclosure may be described in detail and clearly to such an extent that an ordinary one in the art easily implements the present disclosure.

Hereinafter, the best embodiment of the present disclosure will be described in detail with reference to accompanying drawings. With regard to the description of the present disclosure, to make the overall understanding easy, the similar components will be marked by the similar reference signs/numerals in drawings, and thus, additional description will be omitted to avoid redundancy.

Figure 1:
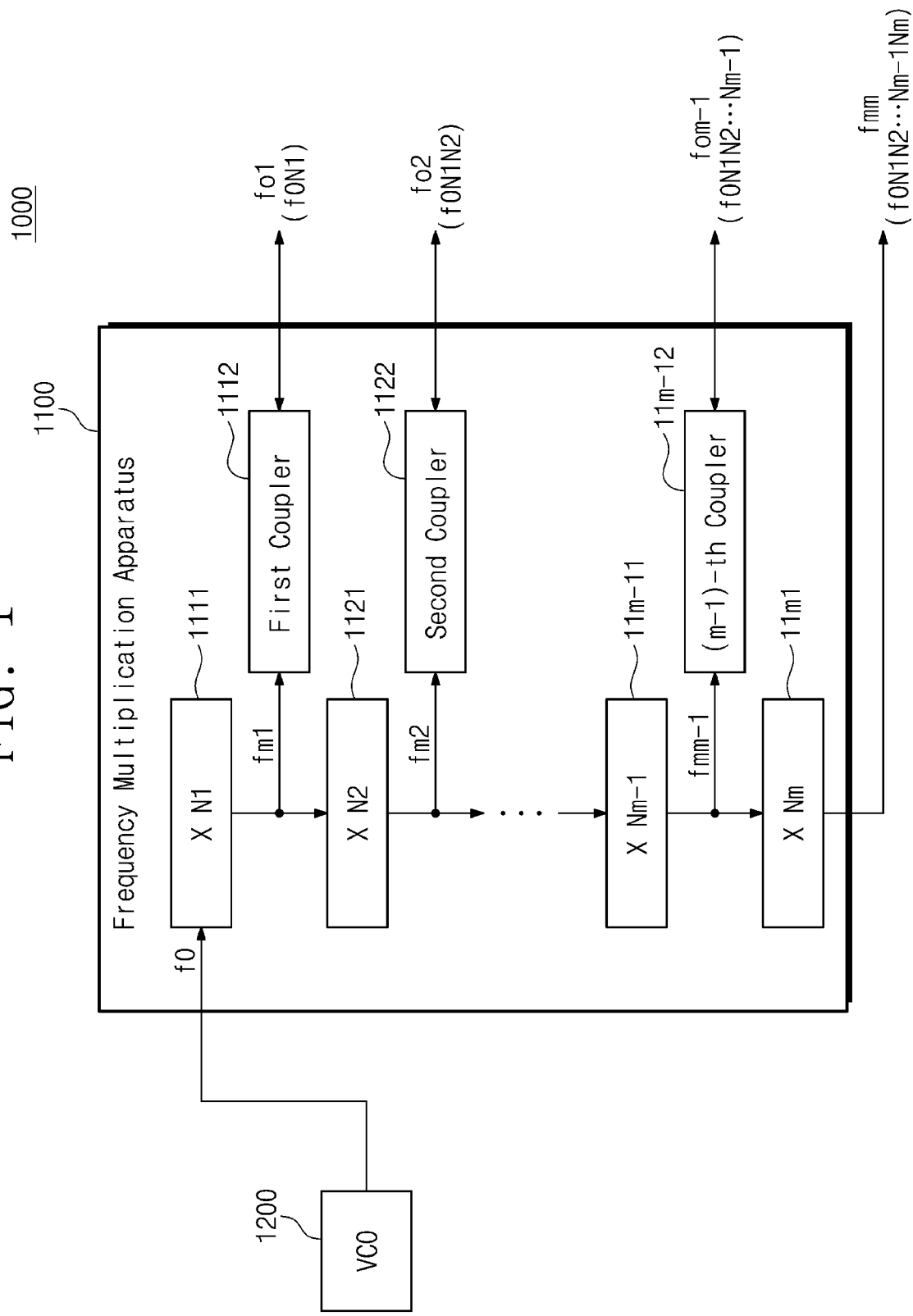
FIG. 1 illustrates a block diagram of a frequency multiplication apparatus, according to an embodiment of the present disclosure.

FIG. 1 illustrates a block diagram of a frequency multiplication apparatus, according to an embodiment of the present disclosure. Referring to FIG. 1, a frequency multiplication apparatus 1000 may include a voltage-controlled oscillator (VCO) 1200 and a frequency multiplication module 1100.

The VCO 1200 may be an oscillator of which an oscillation frequency generated depending on a control voltage is changed. The VCO 1200 may generate an initial signal f0 having an initial frequency. The initial frequency may be in a millimeter-wave band or a sub-terahertz wave band.

In an embodiment, the VCO 1200 may have an oscillation feature for generating a signal having a frequency in a millimeter-wave band or a sub-terahertz wave band. For example, the VCO 1200 may include a varactor. The capacitance of the varactor may be changed depending on a level of a control voltage provided to the varactor. The frequency of the signal generated in the VCO 1200 may be adjusted as the capacitance of the varactor is changed. As another example, the VCO 1200 may further include a component that locks a frequency or phase of the generated signal.

The frequency multiplication module 1100 may receive and multiply the initial signal f0. The frequency multiplication module 1100 may include first to m-th frequency multipliers 1111 to 11m1 ('m' is a positive integer) and first to (m−1)-th couplers 1112 to 11m−12. In an embodiment, the first to m-th frequency multipliers 1111 to 11m1 may be connected in series.

The first to m-th frequency multipliers 1111 to 11m1 may multiply received signals, respectively. The multiplication numbers of the first to m-th frequency multipliers 1111 to 11m1 may be 'N1' to 'Nm' (each of 'N1' to 'Nm' is a positive integer), respectively. For example, the first frequency multiplier 1111 may receive the initial signal f0 from the VCO 1200. The first frequency multiplier 1111 may generate a first multiplication signal fm1 having a first multiplication frequency by multiplying an initial frequency of the initial signal f0 by N1. The first frequency multiplier 1111 may transmit the first multiplication signal fm1 to the second frequency multiplier 1121.

The second frequency multiplier 1121 may generate a second multiplication signal fm2 having a second multiplication frequency by multiplying a first multiplication frequency of the first multiplication signal fm1 by N2. In a similar manner, the m-th frequency multiplier 11m1 may receive an (m−1)-th multiplication signal fmm−1 having an (m−1)-th multiplication frequency. The m-th frequency multiplier 11m1 may generate an m-th multiplication signal fmm having an m-th multiplication frequency by multiplying the (m−1)-th multiplication frequency by Nm.

In an embodiment, amplifiers (not shown) may be added between the first to m-th frequency multipliers 1111 to 11m1, respectively. Each of the amplifiers may amplify the power of a signal received through one input terminal and may transmit the amplified signal to a frequency multiplier connected to an output terminal. At this time, each of the amplifiers may amplify the power of the received signal in response to a feature of the frequency multiplier connected to the output terminal or a feature of the received signal. For example, an amplifier connected to the output terminal of the first frequency multiplier 1111 may be required to have a feature capable of amplifying a signal having a frequency of the first multiplication signal fm1. As another example, to drive the second frequency multiplier 1121, an amplifier connected to the input terminal of the second frequency multiplier 1121 may be required to have an output feature of about 5 to 15 Bm. Gains of the amplifiers may be identical to one another, or may be different from one another.

The first to (m−1)-th couplers 1112 to 11m−12 may be connected to the outputs of the first to (m−1)-th frequency multipliers 1111 to 11m−11, respectively. For example, the first coupler 1112 may be connected between an output terminal of the first frequency multiplier 1111 and an input terminal of the second frequency multiplier 1121. The first coupler 1112 may couple the first multiplication signal fm1 output from the first frequency multiplier 1111. For example, the first coupler 1112 may extract a part of the first multiplication signal fm1 from the first multiplication signal fm1. The first coupler 1112 may output the extracted part of the first multiplication signal fm1 to an external device (not shown).

In a similar manner to the manner described with reference to the first coupler 1112, the second to (m−1)-th couplers 1122 to 11m−12 may be connected between the second to m-th frequency multipliers 1121 to 11m1, respectively. The second to (m−1)-th couplers 1122 to 11m−12 may extract some signals from the second to (m−1)-th multiplication signals fm2 to fmm−1 that are output from the second to (m−1)-th frequency multipliers 1121 to 11m−11, respectively. The second to (m−1)-th couplers 1122 to 11m−12 may output the extracted some signals among the second to (m−1)-th multiplication signals fm2 to fmm−1 to the external device, respectively. Accordingly, the frequency multiplication apparatus 1000 of FIG. 1 may generate signals having two or more different frequencies and may output the generated signals to the external device.

Figure 2:
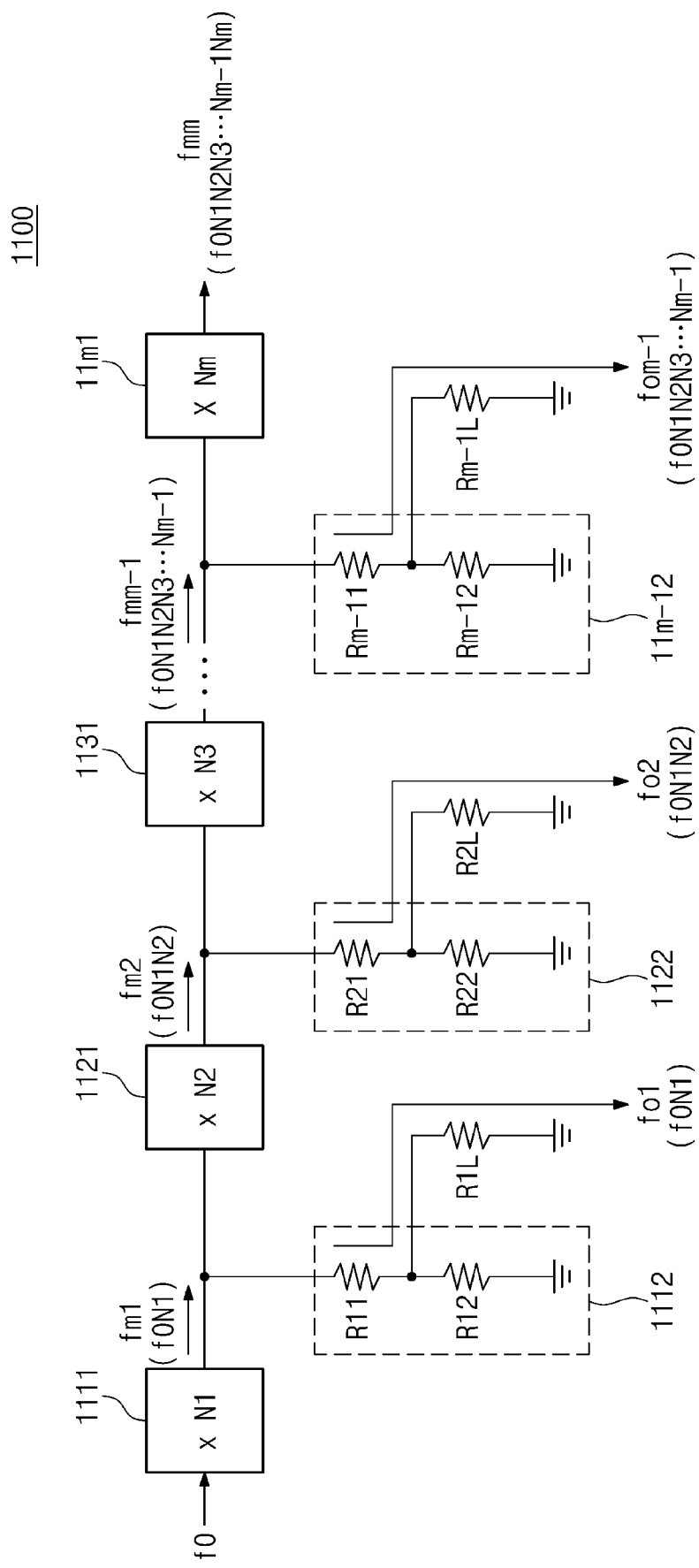
FIG. 2 illustrates a circuit diagram of the frequency multiplication module of FIG. 1.

FIG. 2 illustrates a circuit diagram of the frequency multiplication module of FIG. 1. Referring to FIGS. 1 and 2, the frequency multiplication module 1100 may include the first to m-th frequency multipliers 1111 to 11m1 and the first to (m−1)-th couplers 1112 to 11m−12.

In an embodiment, the first to (m−1)-th couplers 1112 to 11m−12 may be resistor couplers. For example, the first coupler 1112 may include a first resistor R11 and a second resistor R12. One end of the first resistor R11 may be connected to an output of the first frequency multiplier 1111. The other end of the first resistor R11 may be connected to one end of the second resistor R12. The other end of the second resistor R12 may be connected to a ground terminal.

A first load resistor R1L may be connected to the first coupler 1112. For example, the first load resistor R1L may be connected to an output port of the first coupler 1112. One end of the first load resistor R1L may be connected between the first resistor R11 and the second resistor R12. The other end of the first load resistor R1L may be connected to the ground terminal. Accordingly, the first load resistor R1L may be connected in parallel to the second resistor R12.

The first coupler 1112 may extract a part of the first multiplication signal fm1 that is output from the first frequency multiplier 1111. For example, the first coupler 1112 may operate as a power divider, and thus the first coupler 1112 may couple the first multiplication signal fm1. Accordingly, the first coupler 1112 may extract a frequency component f0N1, which is a first multiplication frequency, from the first multiplication signal fm1. The first coupler 1112 may transmit the extracted frequency component f0N1 to the first load resistor R1L. Accordingly, the first coupler 1112 may output a signal having the first multiplication frequency of f0N1 to an external device.

In an embodiment, the first load resistor R1L may be the external device connected to the first coupler 1112. For example, the first load resistor R1L may be an example in which a component operating by receiving the part of the first multiplication signal fm1 extracted by the first coupler 1112 is modeled. The component that receives the extracted part may include an amplifier that amplifies the received part.

A magnitude of a signal being coupled and a magnitude of the signal delivered from the first frequency multiplier 1111 to the second frequency multiplier 1121 may be changed by adjusting values of the first resistor R11 and the second resistor R12. For example, an amount by which the first coupler 1112 couples the first multiplication signal fm1 may be −10 dB. For example, the first coupler 1112 may extract a signal, of which the power is smaller than the power of the first multiplication signal fm1 by 10 dB and which has a first multiplication frequency of the first multiplication signal fm1. In this case, a power loss between the first multiplication signal fm1, which is output from the first frequency multiplier 1111, and a signal received by the second frequency multiplier 1121 may be about −2.2 dB. Accordingly, an operation of the first coupler 1112 may not interfere with an operation of the second frequency multiplier 1121. For example, despite an operation of the first coupler 1112, a signal having sufficient power to multiply the first multiplication frequency may be transmitted to the second frequency multiplier 1121.

Each of the second to (m−1)-th couplers 1112 to 11m−12 may be implemented in a similar manner to the manner described with reference to the first coupler 1112, and may operate in a similar manner to the manner described with reference to the first coupler 1112. Each of the second to (m−1)-th load resistors R2L to Rm−1L may be implemented in a similar manner to the manner described with reference to the first load resistor R1L. For example, the second coupler 1122 may be connected between the output of the second frequency multiplier 1121 and the input of the third frequency multiplier 1131. The second coupler 1122 may couple the second multiplication signal fm2 that is output from the second frequency multiplier 1121. The second load resistor R2L may be connected to the output port of the second coupler 1122. Accordingly, a signal having the second multiplication frequency of the second multiplication signal fm2 may be output through the load resistor R2L connected to the second coupler 1122. In a similar manner, a signal having an (m−1)-th multiplication frequency of an (m−1)-th multiplication signal (f0N1N2N3 ... Nm−1) may be output through the load resistor Rm−1L connected to the (m−1)-th coupler 11m−12.

In accordance with the above-described method, the frequency multiplication apparatus 1000 of FIG. 1 may output signals, which respectively have first to m-th frequencies multiplied by the first to m-th frequency multipliers 1111 to 11m1 included in the frequency multiplication module 1100, through the first to (m−1)-th couplers 1112 to 11m−12. In other words, the frequency multiplication apparatus 1000 of FIG. 1 may output two or more signals having different frequencies. Accordingly, while maintaining a high multiplication number, the frequency multiplication apparatus 1000 may support a variety of different frequency bands at the same time.

Figure 3:
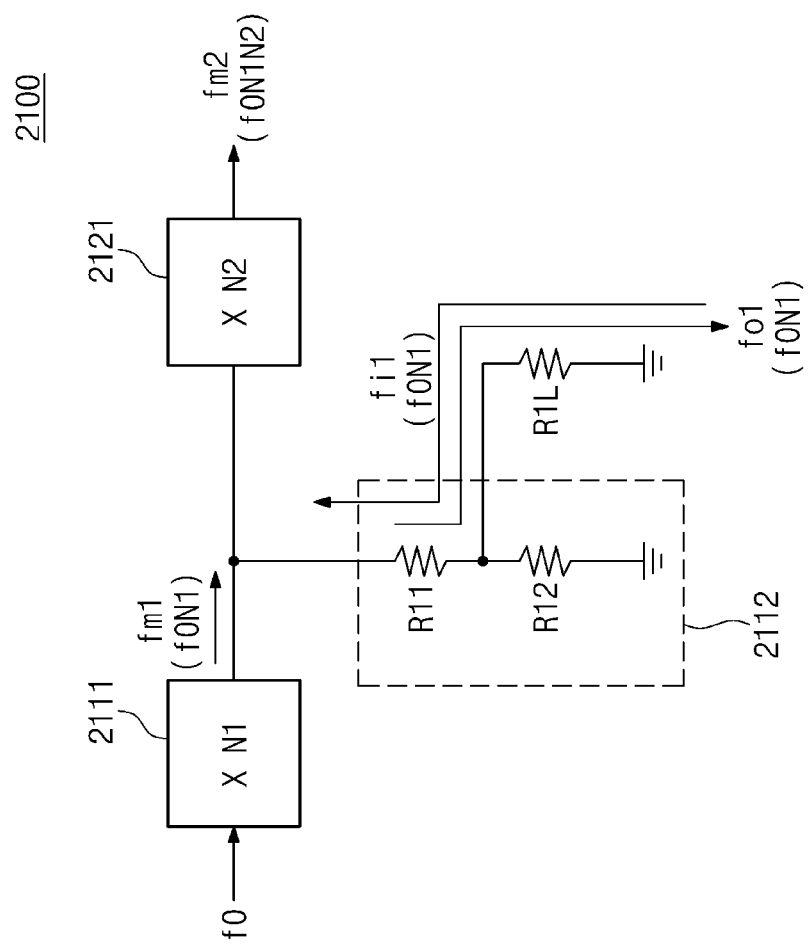
FIG. 3 illustrates a circuit diagram of a frequency multiplication module, according to another embodiment of the present disclosure.

FIG. 3 illustrates a circuit diagram of a frequency multiplication module, according to another embodiment of the present disclosure. Referring to FIGS. 1 and 3, a frequency multiplication module 2100 of FIG. 3 may be another embodiment of the frequency multiplication module 1100 of FIG. 1. For convenience of description, only a first frequency multiplier 2111, a second frequency multiplier 2121, and a first coupler 2112 are illustrated, but the number of frequency multipliers and the number of couplers are not limited thereto. For example, similarly to the frequency multiplication module 1100 of FIG. 1, the frequency multiplication module 2100 may include 'm' frequency multipliers and 'm−1' couplers. Referring to FIG. 3, the frequency multiplication module 2100 may include the first frequency multiplier 2111 having a multiplication number of 'N1', the second frequency multiplier 2121 having a multiplication number of 'N2', and the first coupler 2112.

The first frequency multiplier 2111 and the second frequency multiplier 2121 in FIG. 3 may be implemented similarly to the first frequency multiplier 1111 and the second frequency multiplier 1121 in FIG. 2, respectively. For example, the first frequency multiplier 2111 may multiply a frequency of the received signal by N1, and the second frequency multiplier 2121 may multiply a frequency of the received signal by N2. Each of the first frequency multiplier 2111 and the second frequency multiplier 2121 may include an amplifier.

The first coupler 2112 of FIG. 3 may be implemented in a similar manner to the manner described with reference to the first coupler 1112 of FIG. 2. For example, the first coupler 2112 may be connected between an output terminal of the first frequency multiplier 2111 and an input terminal of the second frequency multiplier 2121. The first coupler 2112 may couple the first multiplication signal fm1 having a first multiplication frequency of 'f0N1'. As a result, the first coupler 2112 may output a first output signal fo1 having the first multiplication frequency through the first load resistor R1L.

The first coupler 2112 may receive a first input signal fi1 from an external device through the first load resistor R1L. For example, an output port of the first coupler 2112 may be used as an input port of the first coupler 2112 for receiving the first input signal fi1. In an embodiment, the first input signal may have the same frequency, that is, a frequency of 'f0N1', as the first multiplication frequency. The first coupler 2112 may transmit the received first input signal fi1 to the second frequency multiplier 2121. The second frequency multiplier 2121 may generate the second multiplication signal fm2 having a second multiplication frequency of 'f0N1N2' by multiplying 'foN1', which is a frequency of the first input signal fi1, by N2. While the second frequency multiplier 2121 multiplies the frequency of the first input signal fi1 by N2, the first frequency multiplier 2111 may be deactivated. In other words, power for multiplying a frequency may not be supplied to the first frequency multiplier 2111. Accordingly, the frequency multiplication module 2100 may operate in a low power mode. A phase noise of the frequency multiplication module 2100 may be 20 log(N) dB, which is a value obtained by taking a logarithm of the multiplication number of the frequency multiplication module 2100. That is, as the frequency multiplication module 2100 multiplies an initial frequency of the initial signal f0 by a higher multiplication number, more noise may occur in an signal output by the frequency multiplication module 2100. For example, when the multiplication number N1 of the first frequency multiplier 2111 is 3, and the multiplication number N2 of the second frequency multiplier 2121 is 3, the multiplication number of the frequency multiplication module 2100 may be 9, which is a product of the multiplication number N1 and the multiplication number N2. In this case, when the first input signal fi1 is not received by the first coupler 2112, a phase noise that is compared to the initial signal f0 of the second multiplication signal fm2 may increase by 20 log(N1N2) dB. On the other hand, when the first input signal fi1 is received by the first coupler 2112, the phase noise that is compared to the initial signal f0 of the second multiplication signal fm2 generated using the first input signal fi1 may increase by only 20 log(N2) dB. As a result, the phase noise performance of the frequency multiplication module 2100 may be improved.

Unlike the illustration of FIG. 3, the frequency multiplication module 2100 may further include third to m-th frequency multipliers and second to (m−1)-th couplers. The third to m-th frequency multipliers and the second to (m−1)-th couplers may be implemented in a similar manner to the manner described with reference to the third to m-th frequency multipliers 1131 to 11m1 and the second to (m−1)-th couplers 1122 to 11m−12 in FIG. 2, and may operate in a similar manner to the manner described with reference to the third to m-th frequency multipliers 1131 to 11m1 and the second to (m−1)-th couplers 1122 to 11m−12 in FIG. 2.

In a similar manner to the manner described with reference to the first coupler 2112, the second to (m−1)-th couplers may receive second to (m−1)-th input signals from an external device, respectively. The second to (m−1)-th couplers may transmit the received second to (m−1)-th input signals to the third to m-th frequency multipliers, respectively. Instead of second to (m−1)-th multiplication signals, the third to m-th frequency multipliers may multiply the received second to (m−1)-th input signals, respectively.

When the frequency multiplication module 2100 operates in a low power mode as the first frequency multiplier 2111 is deactivated, the first input signal fi1 may be applied to an output port of the frequency multiplication module 2100. As a result, the first frequency multiplier 2111 and the second frequency multiplier 2121 may operate independently of each other. Accordingly, phase noises of signals output from the frequency multiplication module 2100 may be improved. Furthermore, signals, which respectively have high frequencies of various bands, may be output from the frequency multiplication module 2100 by further using the third to m-th frequency multipliers.

In an embodiment, the frequency of the first input signal fi1 may be different from the frequency of the first multiplication signal fm1. Accordingly, the frequency multiplication module 2100 may provide a signal source to an external device or a communication system that requires frequencies of various bands.

In an embodiment, signals output from the frequency multiplication module 2100 may be in a millimeter-wave band or a sub-terahertz-wave band. The signals output from the frequency multiplication module 2100 may be provided as one signal source for at least one of 5G mobile communication (5G), wireless personal area network (WPAN), and industrial scientific medical (ISM) communication systems.

In an embodiment, the frequency multiplication apparatus 1000 of FIG. 1 may be implemented using an III-V group compound semiconductor device. In another embodiment, the frequency multiplication apparatus 1000 of FIG. 1 may not include first to (m−1)-th couplers 1112 to 11m−12. In this case, the frequency multiplication apparatus 1000 may output the m-th multiplication signal fmm, which is one output signal.

On the other hand, in an embodiment, a frequency multiplication apparatus including the frequency multiplication module 2100 of FIG. 3 may simultaneously output two or more signals having frequencies of various bands. In another embodiment, the frequency multiplication apparatus including the frequency multiplication module 2100 may be implemented as a complementary metal-oxide-semiconductor (CMOS) device. Accordingly, a frequency multiplication apparatus may include the frequency multiplication module 2100, and thus may have higher cost competitiveness and improved performance.

Figure 4:
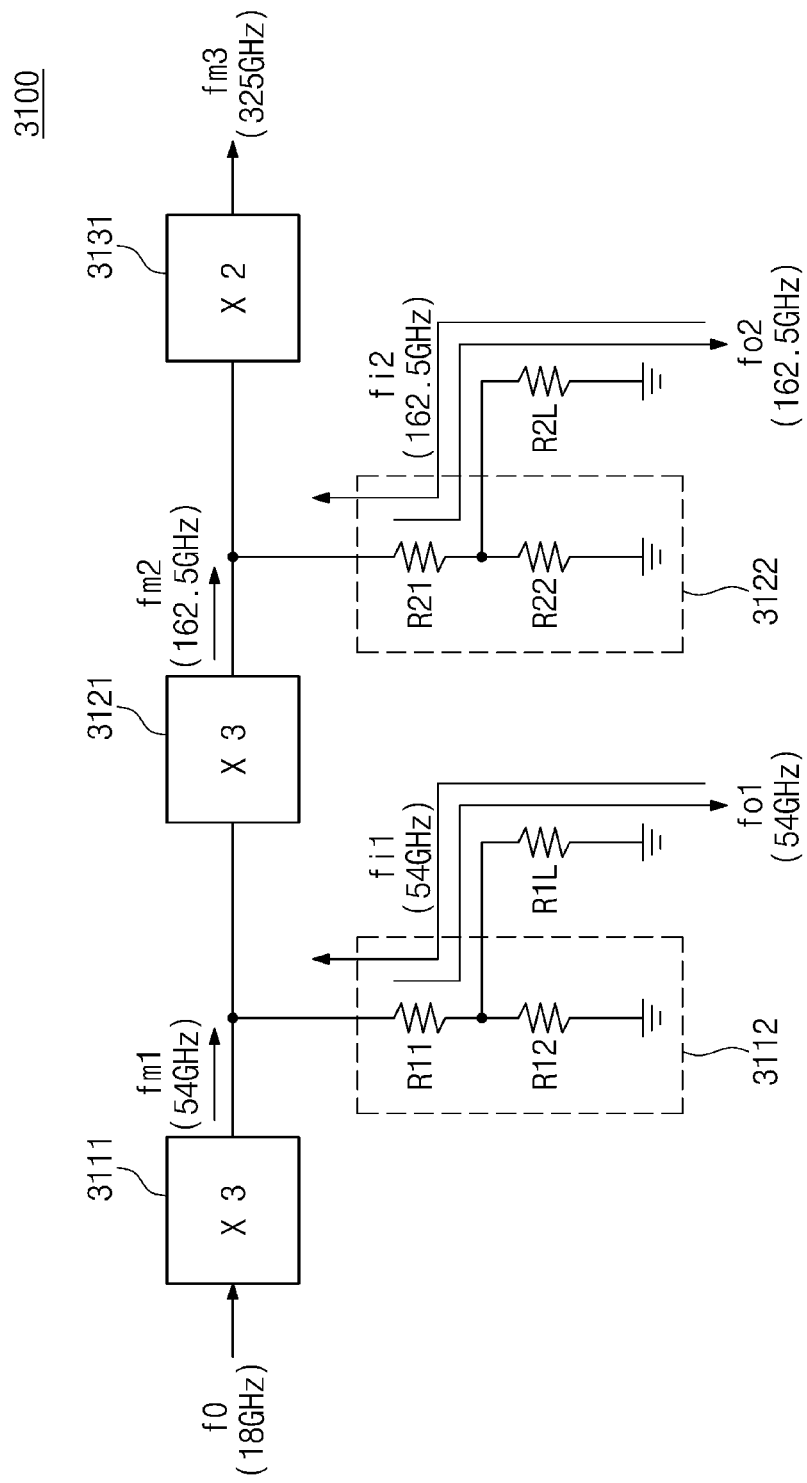
FIG. 4 illustrates a circuit diagram of a frequency multiplication module, according to another embodiment of the present disclosure.

FIG. 4 illustrates a circuit diagram of a frequency multiplication module, according to another embodiment of the present disclosure. Referring to FIGS. 3 and 4, a frequency multiplication module 3100 may include first to third frequency multipliers 3111 to 3131 and first and second couplers 3112 and 3122.

The first frequency multiplier 3111 may receive the initial signal f0 having a frequency of 18 GHz. The multiplication number of the first frequency multiplier 3111 may be 3. The first frequency multiplier 3111 may generate the first multiplication signal fm1 having a frequency of 54 GHz by tripling 18 GHz. The first coupler 3112 may be implemented in a similar manner to the manner described with reference to the first coupler 2112 of FIG. 3, and may operate in a similar manner to the manner described with reference to the first coupler 2112 of FIG. 3. The first coupler 3112 may output the first output signal fo1 having a frequency of 54 GHz to an output port by coupling the first multiplication signal fm1.

In a first operating mode of the second frequency multiplier 3121, the second frequency multiplier 3121 may multiply the frequency of the first multiplication signal fm1. The multiplication number of the second frequency multiplier 3121 may be 3. The second frequency multiplier 3121 may generate the second multiplication signal fm2 having a frequency of 162.5 GHz by tripling the frequency of the first multiplication signal fm1.

In a second operating mode of the second frequency multiplier 3121, the first frequency multiplier 3111 may be deactivated. In this case, the first coupler 3112 may receive the first input signal fi1 having a frequency of 54 GHz by using the output port as an input port. The first coupler 3112 may transmit the received first input signal fiu to the second frequency multiplier 3121.

In the second operating mode of the second frequency multiplier 3121, the second frequency multiplier 3121 may multiply the frequency of the first input signal fi1. The second frequency multiplier 3121 may generate the second multiplication signal fm2 having a frequency of 162.5 GHz by tripling the frequency of the first input signal fi1. The phase noise of the second multiplication signal fm2 may be improved from 20 log(9) dB to 20 log(3) dB, by multiplying the frequency of the first input signal fi1, not a part of the first multiplication signal fm1.

In an embodiment, in the second operating mode of the second frequency multiplier 3121, the frequency of the first input signal fi1 may not be 54 GHz. In this case, the frequency of the second multiplication signal fm2 generated by the second frequency multiplier 3121 may not be 162.5 GHz.

The second coupler 3122 may be implemented in a similar manner to the manner described with reference to the first coupler 3112, and may operate in a similar manner to the manner described with reference to the first coupler 3112. The second coupler 3122 may output a second output signal fo2 having a frequency of 162.5 GHz to an output port by coupling the second multiplication signal fm2.

The multiplication number of the third frequency multiplier 3131 may be 2. In a first operating mode of the third frequency multiplier 3131, the third frequency multiplier 3131 may generate the third multiplication signal fm3 having a frequency of 325 GHz by doubling the frequency of the second multiplication signal fm2.

In a second operating mode of the third frequency multiplier 3131, the second frequency multiplier 3121 may be deactivated. In this case, the second coupler 3122 may receive a second input signal fi2 having a frequency of 162.5 GHz from an external device. The second coupler 3122 may transmit the received second input signal fi2 to the third frequency multiplier 3131.

The third frequency multiplier 3131 may multiply a frequency of the second input signal fi2. The multiplication number of the third frequency multiplier 3131 may be 2. The third frequency multiplier 3131 may generate the third multiplication signal fm3 having a frequency of 325 GHz by doubling the frequency of the second input signal fi2. The phase noise of the third multiplication signal fm3 may be improved from 20 log(6) dB to 20 log(2) dB, by multiplying the frequency of the second input signal fi2, not a part of the second multiplication signal fm2.

In an embodiment, unlike the illustration of FIG. 4, in the second operating mode of the third frequency multiplier 3131, the frequency of the second input signal fi2 may not be 162.5 GHz. In this case, the frequency of the third multiplication signal fm3 generated by the third frequency multiplier 3131 may not be 325 GHz.

Unlike the illustration of FIG. 4, in another embodiment, the frequency multiplication module 3100 may not include the first and second couplers 3112 and 3122. In this case, the phase noise of the frequency multiplication module 3100 may be 20 log(18), that is, 25 dB. On the other hand, in an embodiment including the first and second couplers 3112 and 3122, the frequency multiplication module 3100 may improve a phase noise to 20 log(2) dB by using the first and second input signals fi1 and fi2.

In an embodiment, operating modes of the second frequency multiplier 3121 and the third frequency multiplier 3131 may be determined independently of each other. For example, whether to activate the first and second frequency multipliers 3111 and 3121 may be determined independently.

In an embodiment, the second frequency multiplier 3121 may operate in the second operating mode, and the third frequency multiplier 3131 may operate in the first operating mode. Accordingly, the first frequency multiplier 3111 may be deactivated; and, the second frequency multiplier 3121 may generate the second multiplication signal fm2 by multiplying the frequency of the first input signal fi1. In this case, the second input signal fi2 may not be applied to the second coupler 3122. Besides, the third frequency multiplier 3131 may generate the third multiplication signal fm3 by using a part of the second multiplication signal fm2.

As another example, the second frequency multiplier 3121 may operate in the first operating mode, and the third frequency multiplier 3131 may operate in the second operating mode. Accordingly, the first frequency multiplier 3111 may be activated, and the second frequency multiplier 3121 may be deactivated. The first frequency multiplier 3111 may generate the first multiplication signal fm1 by tripling the frequency of the initial signal f0, and then may output the first multiplication signal fm1 to the first coupler 3112. The second coupler 3122 may receive the second input signal fi2 and may transmit the second input signal fi2 to the third frequency multiplier 3131. The third frequency multiplier 3131 may generate the third multiplication signal fm3 by doubling the frequency of the received second input signal fi2. At this time, unlike the illustration of FIG. 4, the frequency of the second input signal fi2 may not be 162.5 GHz. As a result, the frequency of the third multiplication signal fm3 may not also be 325 GHz.

In other words, the first to third frequency multipliers 3111 to 3131 may be selectively activated or deactivated. As a result, the multiplication number of the frequency multiplication module 3100, a phase noise, and bands of frequencies of output signals may be adjusted.

Figure 5:
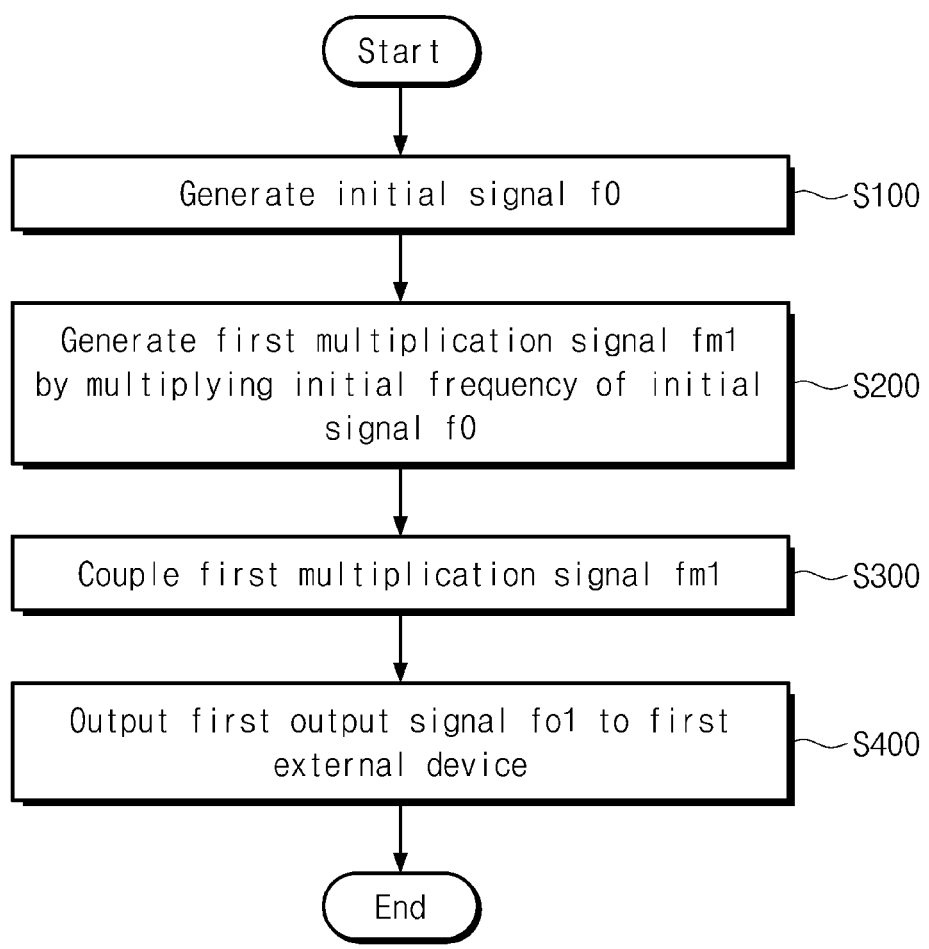
FIG. 5 illustrates a flowchart of a frequency multiplication method.

FIG. 5 illustrates a flowchart of a frequency multiplication method. Referring to FIGS. 1 and 5, the frequency multiplication apparatus 1000 may perform operation S100 to operation S400.

In operation S100, the frequency multiplication apparatus 1000 may generate the initial signal f0. For example, the VCO 1200 of the frequency multiplication apparatus 1000 may generate the initial signal f0 having the initial frequency 'f0'.

In operation S200, the frequency multiplication apparatus 1000 may generate the first multiplication signal fm1 by multiplying the initial frequency of the initial signal f0. For example, the first frequency multiplier 1111 included in the frequency multiplication module 1100 of the frequency multiplication apparatus 1000 may generate the first multiplication signal fm1 having a first multiplication frequency by multiplying the initial frequency of the initial signal f0 by N1.

In operation S300, the frequency multiplication apparatus 1000 may couple the first multiplication signal fm1. For example, the first coupler 1112 included in the frequency multiplication module 1100 of the frequency multiplication apparatus 1000 may extract a part of the first multiplication signal fm1. The first coupler 1112 may extract the output signal fo1 having the same frequency as the first multiplication frequency of the first multiplication signal fm1.

In operation S400, the frequency multiplication apparatus 1000 may output the first output signal fo1 to the first external device. For example, the first coupler 1112 included in the frequency multiplication module 1100 of the frequency multiplication apparatus 1000 may output the first output signal fo1 to a first external device through an output port.

In an embodiment, the frequency multiplication apparatus 1000 may generate the second multiplication signal fm2 having a second multiplication frequency by multiplying the first multiplication frequency by 'm' ('m' is a positive integer). The frequency multiplication apparatus 1000 may transmit a part of the second multiplication signal fm2 to the second coupler 1122. The frequency multiplication apparatus 1000 may output the second multiplication signal fm2 to a second external device through the second coupler 1122.

In another embodiment, in operation S400, the frequency multiplication apparatus 1000 may deactivate the first frequency multiplier 1111. The frequency multiplication apparatus 1000 may receive a first external signal (e.g., fiu in FIG. 3) having a first multiplication frequency through the first coupler 2112. The frequency multiplication apparatus 1000 may generate the second multiplication signal fm2 having a second multiplication frequency by multiplying the first multiplication frequency of the first external signal by N2. The frequency multiplication apparatus 1000 may transmit a part or all of the second multiplication signal fm2 to the second coupler 1122. The frequency multiplication apparatus 1000 may output the transmitted second multiplication signal fm2 to the second external device through the second coupler 1122. In an embodiment, the first external signal may have a frequency different from the first multiplication frequency. Accordingly, unlike the illustration of FIG. 5, the second multiplication signal fm2 may have a frequency different from the second multiplication frequency.

Figure 6:
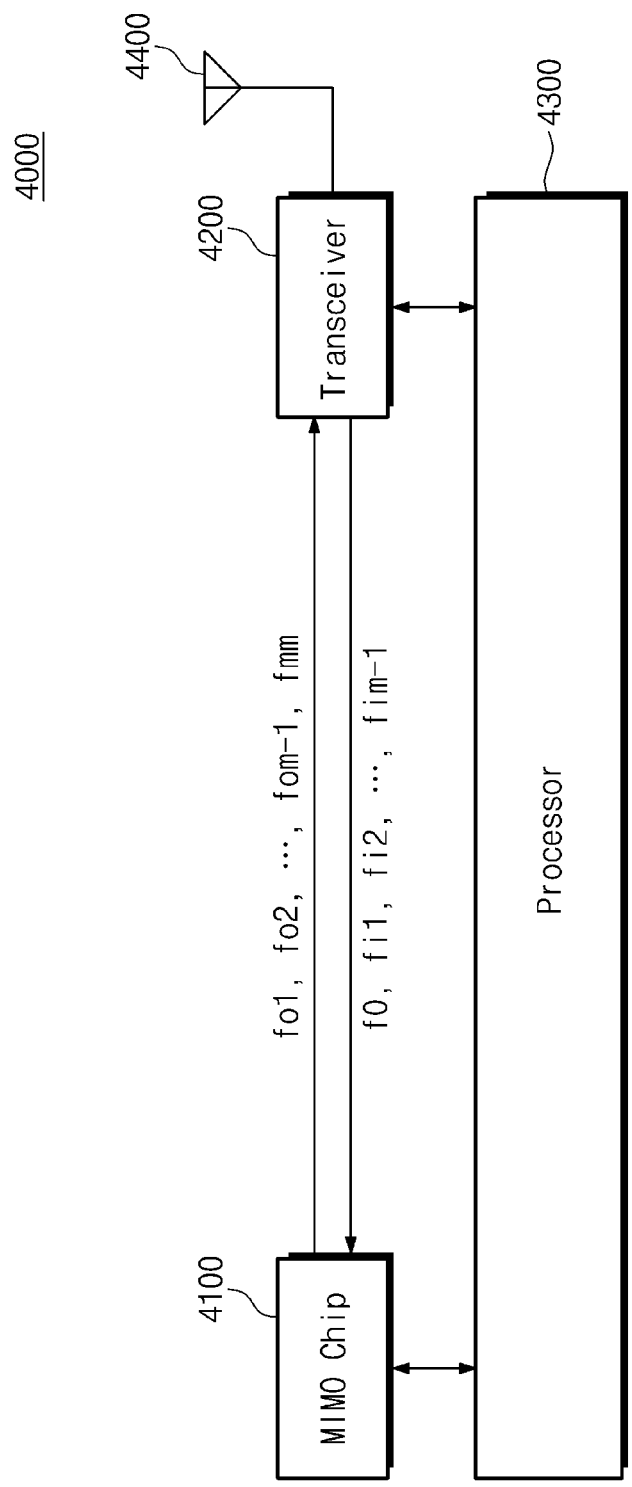
FIG. 6 is a block diagram of a frequency multiplication apparatus including a MIMO chip, according to an embodiment of the present disclosure.

FIG. 6 is a block diagram of a frequency multiplication apparatus including a MIMO chip, according to an embodiment of the present disclosure. Referring to FIG. 6, a frequency multiplication apparatus 4000 may include a multiple-input and multiple-output (MIMO) chip 4100, a transceiver 4200, a processor 4300, and an antenna 4400. In an embodiment, the MIMO chip 4100 may include the frequency multiplication module 1100 of FIG. 1 or the frequency multiplication module 3100 of FIG. 3.

The MIMO chip 4100 may receive input signals fi1 to fim−1 having different frequencies. The MIMO chip 4100 may output a plurality of signals fo1 to fom−1 and fmm having different frequencies. The MIMO chip 4100 may multiply frequencies of the input signals fi1 to fim−1 by various multiplication numbers by controlling whether to activate frequency multipliers, respectively. The MIMO chip 4100 may provide the plurality of signals fo1 to fom−1 and fmm having frequencies in a millimeter-wave band and a sub-terahertz-wave band.

The transceiver 4200 may modulate a voice signal or a data signal by using one of the plurality of signals fo1 to fom−1 and fmm, and then may transmit the modulated voice signal or the modulated data signal through the antenna 4400. Alternatively, the transceiver 4200 may demodulate a signal received through the antenna 4400 by using one of the plurality of signals fo1 to fom−1 and fmm. For example, the transceiver 4200 may use one of the plurality of signals fo1 to fom−1 and fmm as a signal source for 5G mobile communication, WPAN, and ISM communication.

The processor 4300 may function as a central processing unit of the frequency multiplication apparatus 4000. The processor 4300 may process a signal, which is transmitted to the transceiver 4200 or is received from the transceiver 4200, and then may convert and process the signal into voice or data.

The frequency multiplication apparatus 4000 may be a terminal or a base station for communication in a millimeter-wave band and a sub-terahertz-wave band. The frequency multiplication apparatus 4000 may provide signal sources of various frequencies through a single chip, by using the MIMO chip 4100 according to an embodiment of the present disclosure. Accordingly, a cost for implementing the frequency multiplication apparatus 4000 may be lowered, and a phase noise may be improved.

According to an embodiment of the present disclosure, a frequency multiplication apparatus that outputs a plurality of signals having different frequency bands at the same time may be provided while maintaining a high multiplication number. Also, the frequency multiplication apparatus capable of controlling operations of a plurality of frequency multipliers independently by receiving a plurality of signals having different frequency bands and capable of improving a phase noise may be provided. Accordingly, the frequency multiplication apparatus which is economical and has the improved performance may be provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A frequency multiplication apparatus, the apparatus comprising:
    a first frequency multiplier configured to receive a first signal having a first frequency and to output at a node a second signal having a second frequency by multiplying the first frequency by 'n' ('n' being a positive integer);
    a second frequency multiplier configured to receive the second signal at the node and to output a third signal having a third frequency by multiplying the second frequency by 'm' ('m' being a positive integer); and
    a first coupler including a first resistor having an end electrically connected to the node and another end connected to an output port of the frequency multiplication apparatus to output a part of the second signal to an external load.

2. The apparatus of claim 1, wherein the first frequency multiplier and the second frequency multiplier are connected to each other in series, and
    the one end of the first resistor is not electrically connected to the another end of the first resistor.

3. The apparatus of claim 1, wherein
    the first coupler further comprises a second resistor having an end electrically connected to ground and another end electrically connected to the another end of the first resistor.

4. The apparatus of claim 1, wherein the second frequency and the third frequency are included in a millimeter-wave band or a sub-terahertz-wave band.

5. The apparatus of claim 1, wherein the second signal of the second frequency and the third signal of the third frequency are provided as signal sources for at least one of 5G mobile communication (5G), 6G mobile communication (6G), wireless personal area network (WPAN), and industrial scientific medical (ISM) communication systems.

6. The apparatus of claim 1, further comprising:
    a third frequency multiplier configured to receive the third signal and to output a fourth signal having a fourth frequency by multiplying the third frequency by 'k' ('k' being a positive integer),
    wherein the third frequency multiplier is connected to an output of the second frequency multiplier in series.

7. The apparatus of claim 6, further comprising:
    a second coupler connected between the output of the second frequency multiplier and an input of the third frequency multiplier and configured to output a part of the third signal.

8. The apparatus of claim 7, wherein the first frequency multiplier is deactivated, and
    wherein the second frequency multiplier receives a fifth signal having a fifth frequency through the first coupler and outputs a sixth signal having a sixth frequency by multiplying the fifth frequency by the 'm', and
    wherein the third frequency multiplier receives the sixth signal and outputs a seventh signal having a seventh frequency by multiplying the sixth frequency by the 'k'.

9. The apparatus of claim 7, wherein the first frequency multiplier and the second frequency multiplier are deactivated,
    wherein the third frequency multiplier receives a fifth signal having a fifth frequency through the second coupler and outputs a sixth signal having a sixth frequency by multiplying the fifth frequency by the 'k'.

10. The apparatus of claim 1, wherein 'm' is not equal to 'n'.

11. The apparatus of claim 1, the frequency multiplication apparatus being implemented as a single multiple-input and multiple-output (MIMO) integrated circuit (IC) chip.

12. The apparatus of claim 1, wherein the first frequency multiplier and the second frequency multiplier are selectively activated and deactivated.

13. A frequency multiplication apparatus, the apparatus comprising:
    a first frequency multiplier configured to receive a first signal having a first frequency and to output a second signal having a second frequency by multiplying the first frequency by 'n' ('n' being a positive integer);
    a second frequency multiplier configured to receive the second signal and to output a third signal having a third frequency by multiplying the second frequency by 'm' ('m' being a positive integer); and
    a coupler connected between an output of the first frequency multiplier and an input of the second frequency multiplier and configured to output a part of the second signal, wherein the first frequency multiplier is deactivated, and
    wherein the second frequency multiplier receives a fourth signal having a fourth frequency through the coupler and outputs a fifth signal having a fifth frequency by multiplying the fourth frequency by the 'm'.

14. The apparatus of claim 13, wherein the fourth frequency is identical to the second frequency.

15. A frequency multiplication method, the method comprising:
    in a first operating mode, receiving an initial signal having an initial frequency;
    in the first operating mode, generating a first signal having a first multiplication frequency by multiplying the initial frequency by 'n' ('n' being a positive integer);

in the first operating mode, outputting the first signal to a first external device through a first coupler circuit;

in the first operating mode, generating a second signal having a second multiplication frequency by multiplying the first multiplication frequency by 'm' ('m' being a positive integer);

in a second operating mode, receiving a first input signal having a first input frequency through the first coupler circuit; and in the second operating mode, generating a third signal having a third multiplication frequency by multiplying the first input frequency by the 'm'.

16. The method of claim 15, wherein the first input frequency is identical to the first multiplication frequency.

17. A frequency multiplication method, the method comprising:

in a first operating mode, receiving an initial signal having an initial frequency;

in the first operating mode, generating a first signal having, a first multiplication frequency by a first frequency multiplier by multiplying the initial frequency by 'n' ('n' being a positive integer);

in the first operating mode, outputting the first signal to a first external device through a first coupler circuit; and in the first operating mode, generating a second signal having a second multiplication frequency by a second frequency multiplier by multiplying the first multiplication frequency by 'm' ('m' being a positive integer), wherein at least one of 'n' and 'm' is greater than 2, wherein the first coupler circuit includes two resistors electrically connected in series between an output of the first frequency multiplier and electrical ground, an external load electrically connected in parallel with a one of the two resistors that is connected to electrical ground.

18. A frequency multiplication method, the method comprising:

in a first operating mode, receiving an initial signal having an initial frequency;

in the first operating mode, generating a first signal having a first multiplication frequency by a first frequency multiplier by multiplying the initial frequency by 'n' ('n' being a positive integer);

in the first operating mode, outputting the first signal to a first external device through a first coupler circuit;

in the first operating mode, generating a second signal having a second multiplication frequency by a second frequency multiplier by multiplying the first multiplication frequency by 'm' ('m' being a positive integer), wherein at least one of 'n' and 'm' is greater than 2; and selectively activating and deactivating the first frequency multiplier and the second frequency multiplier based on whether in the first operating mode or in a second operating mode.

* * * * *